(12) United States Patent
Font Aranega et al.

(10) Patent No.: US 8,952,703 B2
(45) Date of Patent: Feb. 10, 2015

(54) TERMINATION AND CHECKING HAND TOOL

(75) Inventors: Albert Font Aranega, Badalona (ES); Didier Claeys, Schaffen (BE)

(73) Assignees: Tyco Electronics AMP Espana SA, Barcelona (ES); Tyco Electronics Raychem BVBA, Kessel-Lo (BE)

( * ) Notice: Subject to any disclaimer, the term of this patent is extended or adjusted under 35 U.S.C. 154(b) by 801 days.

(21) Appl. No.: 13/160,126

(22) Filed: Jun. 14, 2011

(65) Prior Publication Data

US 2011/0304343 A1    Dec. 15, 2011

(30) Foreign Application Priority Data

Jun. 14, 2010    (EP) .................................... 10382171

(51) Int. Cl.
*G01R 31/04*    (2006.01)
*H01R 43/01*    (2006.01)

(52) U.S. Cl.
CPC ............ *H01R 43/015* (2013.01); *G01R 31/045* (2013.01)
USPC ...................................................... 324/538

(58) Field of Classification Search
USPC .............. 324/538–539, 500, 543, 76.11, 148, 324/756.05; 439/352, 350, 351, 353–358
See application file for complete search history.

(56) References Cited

U.S. PATENT DOCUMENTS

| 3,755,632 | A | | 8/1973 | Johnson |
| 5,285,163 | A | * | 2/1994 | Liotta ........................... 324/508 |
| 5,720,623 | A | * | 2/1998 | Polenick et al. .............. 439/352 |
| 6,704,992 | B2 | * | 3/2004 | Minor .......................... 29/566.4 |
| 7,103,968 | B2 | * | 9/2006 | Karrasch ........................ 29/758 |

FOREIGN PATENT DOCUMENTS

EP    1 484 824 A2    12/2004

OTHER PUBLICATIONS

European Search Report issued by the European Patent Office, dated Dec. 1, 2010, for European Patent Application No. EP 10 38 2171; 8 pages.

* cited by examiner

*Primary Examiner* — Melissa Koval
*Assistant Examiner* — Trung Nguyen
(74) *Attorney, Agent, or Firm* — Merchant & Gould P.C.

(57) ABSTRACT

A hand tool for terminating and checking comprising a body which defines a means of storage of a connector to be terminated; an electrical checking module may be housed in the body, and is configured to electrically check the terminated connector when a connector pusher element is inserted in the terminated connector in the close or final position.

17 Claims, 7 Drawing Sheets

TERMINATION AND CHECKING HAND TOOL

This invention refers in general to a hand tool for terminating an electrical cable with a connector and checking of the termination made.

An apparatus and method for terminating an electrical cable are known in the art based on European patent EP 1 484 824 B1 incorporated herein by reference, where the cable comprises a plurality of wires of a cable relative to each other and terminating the cable with a connector by connecting the wires to terminals of the connector.

The apparatus in question comprises a termination tool configured to receive or not a cable manager for cooperation with said connector wherein the cable manager is for positioning the wires in a fixed space relationship relative to each other including guide means for engaging a complementary surface of the connector to guide the terminals into an electrically contacting relationship with said wires, and wherein the termination tool comprises a pusher for urging the connector into full engagement with the cable manager through a squeezing force normal to the axis of said cable; where the termination tool includes a receiving slot for receiving said connector and cooperating cable manager, and an actuation member pivotally interconnected between the pusher and a handle, the handle being operable to move the actuation member within said receiving slot and to thereby force the connector fully into engagement with the cable manager.

At least one disadvantage of the present state of the art derives from the fact that once the connector has been terminated or inserted it is not known whether the connector has been correctly inserted, that is, each of the cable conductors has been connected to a terminal of the connector, and whether said connection has been made without any short circuits and/or false contacts.

This invention seeks to resolve or reduce one or more of the disadvantages described above by means of a termination and checking tool as defined in the claims.

One embodiment of the termination and checking tool comprises a body which defines a means of storage or receiving slot of a connector which terminates on an opposite side to a pivot axis passing through the body with a handle associated with the body; a module for electrical checking may be housed in proximity to the pivot axis and is configured to electrically check a terminated connector when a pusher element of a connector is inserted in a connector of a different type within a terminated connector, while the handle remains in close or final position, that is, the handle is folded against the body of the tool.

The checking module comprises means for indication of the result of the electrical check carried out; thus an indicator, for example a LED type by means of a different colour code, will show the result of the electrical check carried out.

In the case of visual indicator, for example a LED type, each colour of the visual indicator is associated with a possible result of the electrical verification, for example, the green colour is associated with a terminated connector free from electrical defects, the colour red is associated with a terminated connector which has at least one short circuit, and the colour yellow is associated with a terminated connector which has at least one electrical discontinuity between a connector terminal and a cable wire.

An advantage of a termination tool which makes an electrical check of a terminated connector is that when an operator removes a terminated connector from said tool, the operator is able to ascertain whether the connector is prepared to work properly once it has been installed or connected to a data apparatus excluding most common failures without additional control.

Furthermore, the operator only uses one tool for terminating the connector and checking it electrically.

A more detailed explanation of devices and/or methods in accordance with embodiments of the invention are provided in the following description based on the attached figures in which.

Pursuant to FIGS. 1 to 7 an embodiment is shown of the termination and checking hand tool 110 in general. The tool 110 comprises a body 111 which defines a first housing 115 for a connector 8 and a second housing 120 for a cable 6.

The tool also comprises means for stripping the terminals of a plurality of conductors or cable wires 6 as is known from the European patent EP 1 484 824 B1 and incorporated herein by reference.

The tool 110 also includes an actuation member 130, which has a finger pull 131 and a pusher element 135 similar to the connector of the mating type used in telephony and/or data transmission in order to connect a cable with an apparatus, which clicks when the terminated connector and the telephone/data transmission apparatus are connected for example.

In addition, the tool 110 includes a handle 140 which is able to pass from an open working position, in which the connector 8 may be housed in a storage means or receiving slot and a cable 6 may also be housed in a second housing 120; at a closed or final working position in which the connector has been inserted or terminated.

In the locked position of the handle 140 a lug 143 of the handle 140 engages in mating relationship with the actuation member 130. In addition, a lug 144 provides a seating engagement for a cable manager.

A cable slot 121 provides a groove through a second housing 120 for a cable, as well as a coupling attachment for cable reinforcement on a cable manager.

The tool 110 also comprises on the side opposite the second housing 120, an electrical checking module of a terminated connector configured to make an electrical check of the terminated or pressed connector. Said check is made with the handle 140 in close or final position, that it the connector is electrically checked prior to being removed from the first housing 115.

Figure 1:
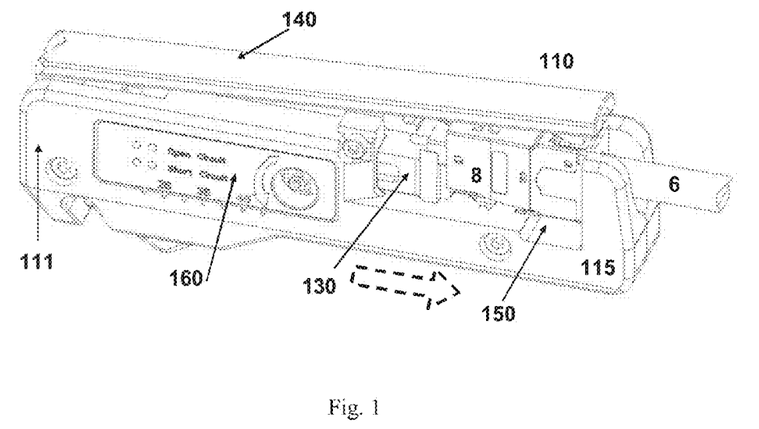
FIG. 1 shows a perspective view of a termination and checking hand tool where a handle is closing.
Figure 2:
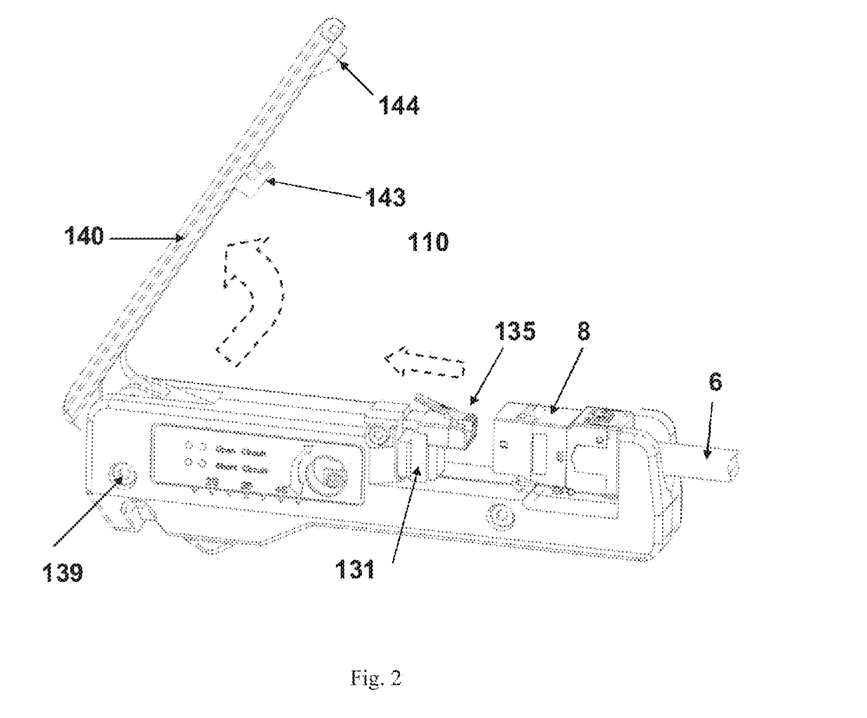
FIG. 2 shows a perspective view of the termination and checking hand tool 1 where the handle is opening.
Figure 3:
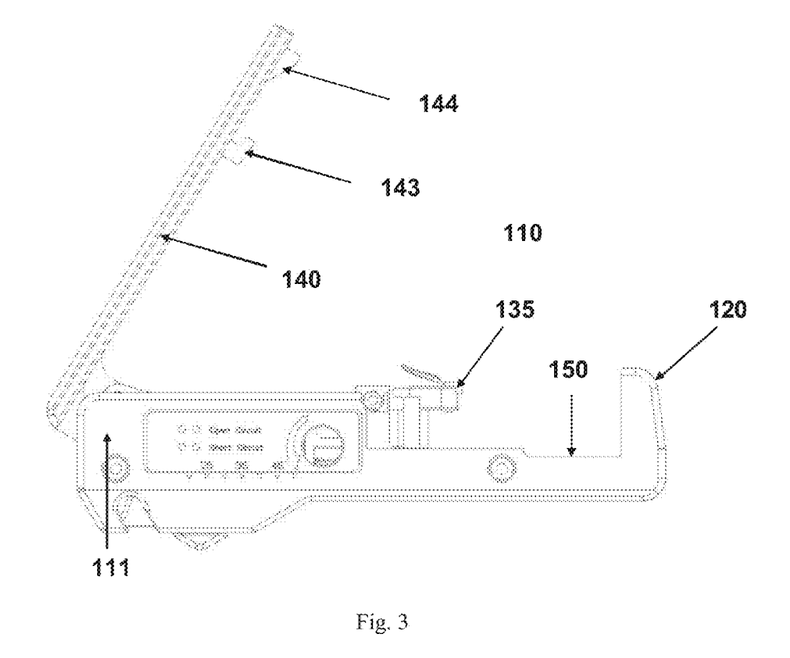
FIG. 3 shows a front view of the termination and checking hand tool.
Figure 4:
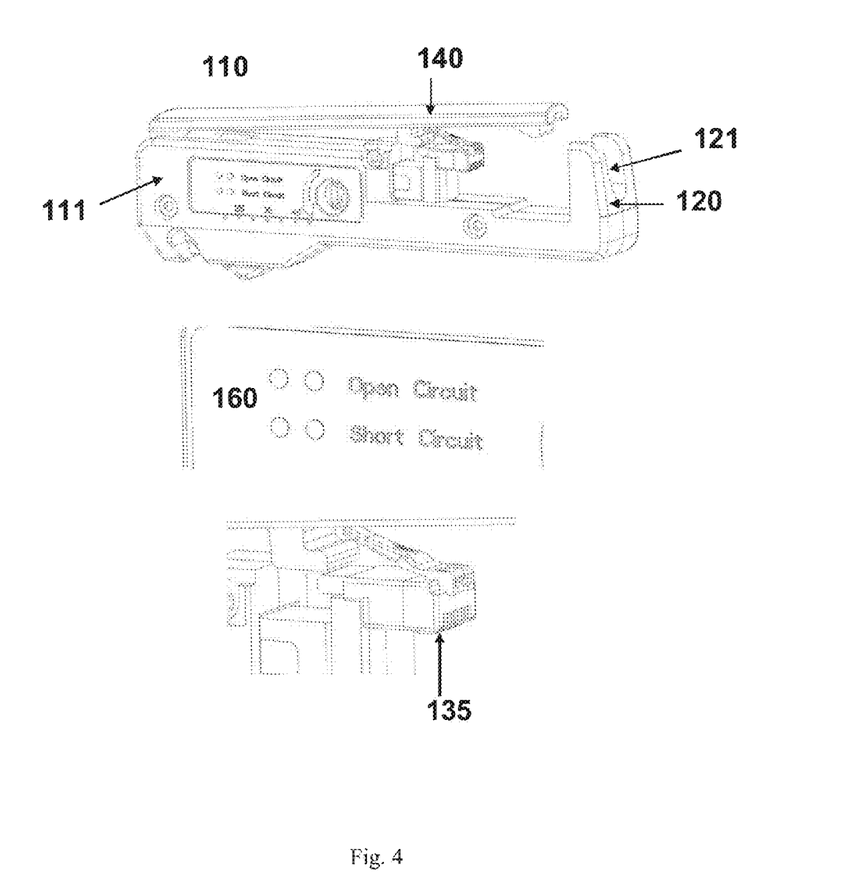
FIG. 4 shows a perspective view of the termination and checking hand tool where the handle is closing, a view of an electrical checking module and a detail of a pusher element.

FIG. 3 shows the handle 140 in an intermediate position between the open working position and the close or final position, which shows the movement of the finger pull 131 as well as the actuation member 130 and the pusher of the male connector 135 initiating insertion in the female connector 8 when the handle 140 is moved to closing or final position.

The rotation movement of the handle 140 from the open to close or final position and vice versa is carried out around an anchor pin 139, which results in the lateral movement of the finger pull 131 and the associated actuation element 130 and the pusher of the male connector 135.

The force used to move the handle 140 towards the body of the tool 110 during insertion or termination of the connector 8 is generally normal to the axis of the cable 6 to be terminated.

Figure 5:
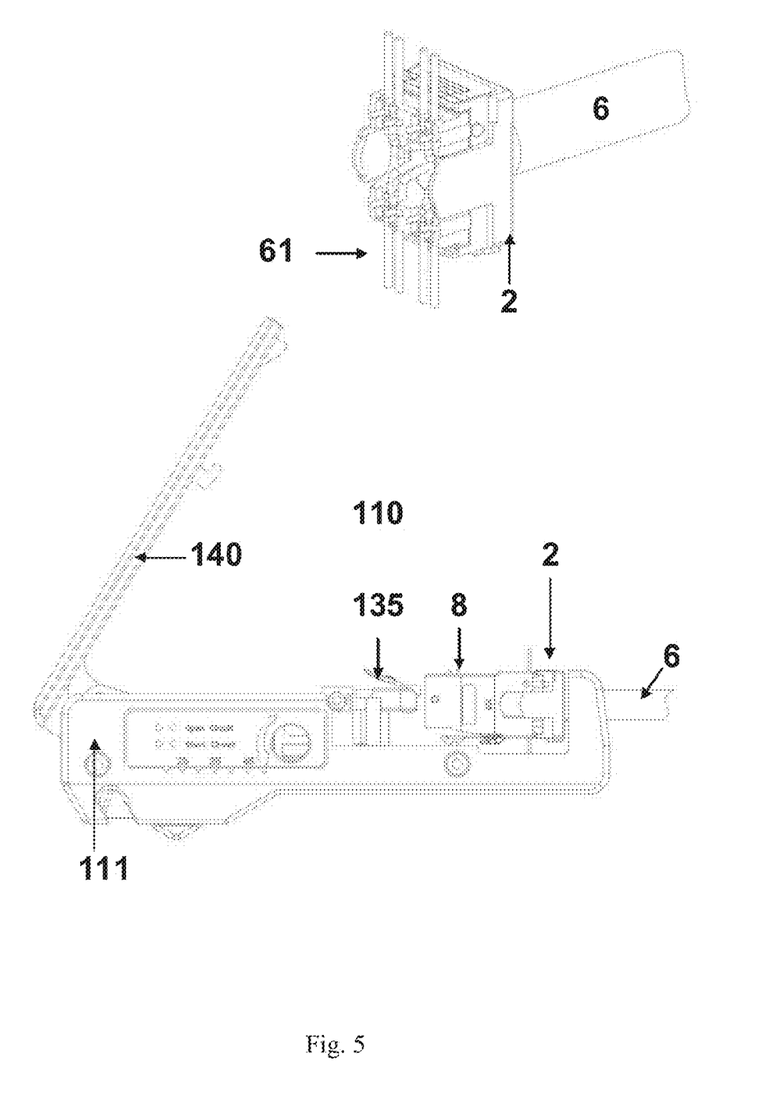
FIG. 5 shows a detail of perspective view of a cable, a cable manager and their position in the termination and checking hand tool.

FIG. 5 also shows the cable 6, a cable manager 2, and the connector 8 in a storage means or receiving slot 150 of the first housing 115.

The cable 6 comprises a plurality of wires 61 and those wires 61 will terminate in insulation displacement slots 81 of the contacts in the connector 8 through the cable manager 2.

The cable slot 121 in the first and second housing 115, 120 provides for pass through of cable 6. It should be noted that the width of cable slot 121 has a dimension or diameter configured to house cables of different sections.

The cable manager 2 is configured to permit positioning of the cable 6 for termination as well as extraction of the cable manager following termination of the connector 8.

Recessing of the connector 8 and the cable 6 is described in detail in the European patent EP 1 484 824 B1, which is incorporated herein by reference.

When the cable 6 has been inserted in the interior of the cable manager 2 the cable manager is closed squeezing a ball detent which snaps into a recess.

The cable is held in place within its manager. The cable is maintained by means of the frictional force provided, at least in part, by the cable manager operator grasping the cable manager surface which acts as a cable clamp.

When the cable manager is closed with the cable 6 wires spread within the manager and aligned within a pair of internal and external slots. A wire pushing wall and slot extend under the wire to be terminated. The connector 8 contacts to be used to terminate the cable 6 each have an insulation displacement slot which projects from a connection end opposite to that of the mating end.

The connector 8 engages partially with the wires pushing the end of the connector connection slightly towards the cable manager 2. The projections on the connector 8 provide a close sliding fit within the recesses on the cable manager 2 thus aligning the contacts with the contact parts of the wires. A connector and cable manager used in the various embodiments may be configured in a complementary manner, so that the connector is able to engage with the cable manager only in one orientation.

The cable manager 2 and the connector 8 are then placed in the tool 110 with the connector pusher 135 in a retracted position. The handle 140 is then squeezed so that the cable pusher 135 moves laterally and thereby forces the connector 8 fully into engagement with the cable manager 2. The body of the termination tool 110 provides the opposing force for the terminal insertion in a connector. As this occurs, each wire is additionally pushed further towards the appropriate slot in one of the insulation displacement contacts.

The lug 143 acts as a handle stop in order to provide the operator with a means of identifying that the tool has inserted the wires to the maximum depth obtainable with the tool 110 and the connector is installed on stationary wires.

Cutting blades shall also extend towards a cutting position and shall sever the wires. The force used by squeezing the handle 140 to the tool 110 body 111 is generally normal to the cable axis which is to be terminated.

Furthermore, the connector pusher 135 is inserted in the connector 8 to be terminated in order to make the electrical check prior to the release of the handle 140, and the cable manager 2 and the connector 8 may be extracted from the termination tool 110.

Having made the electrical check, the cable manager is extracted from the cable 6 pulling in the first place from the connector towards the cable manager. The cable moves through the cable manager as the connector is removed. Subsequently it may be pulled outwards from the free ends of the wires which have been severed from the remaining parts thereof and which may be retained in the slots of the cable manager 2 for their disposal.

To summarize, the termination of a connector is made substantially simultaneously to the electrical checking thereof by means of the connector pusher 135 electrically connected to the checking module.

Figure 6:
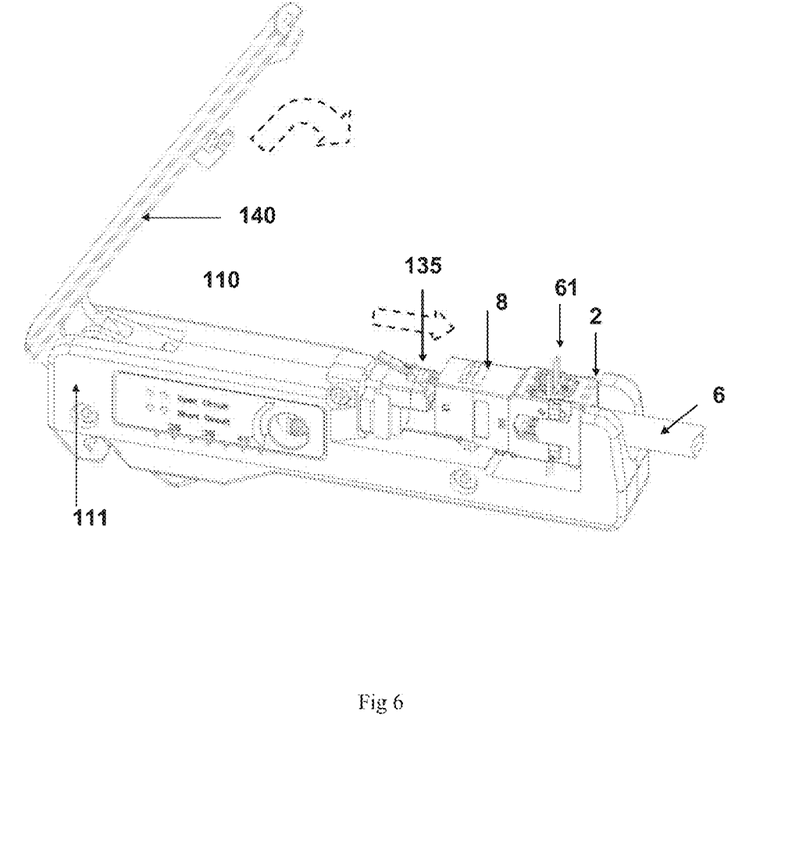
FIG. 6 shows a perspective view of the termination and checking hand tool where a handle is closing.
Figure 7:
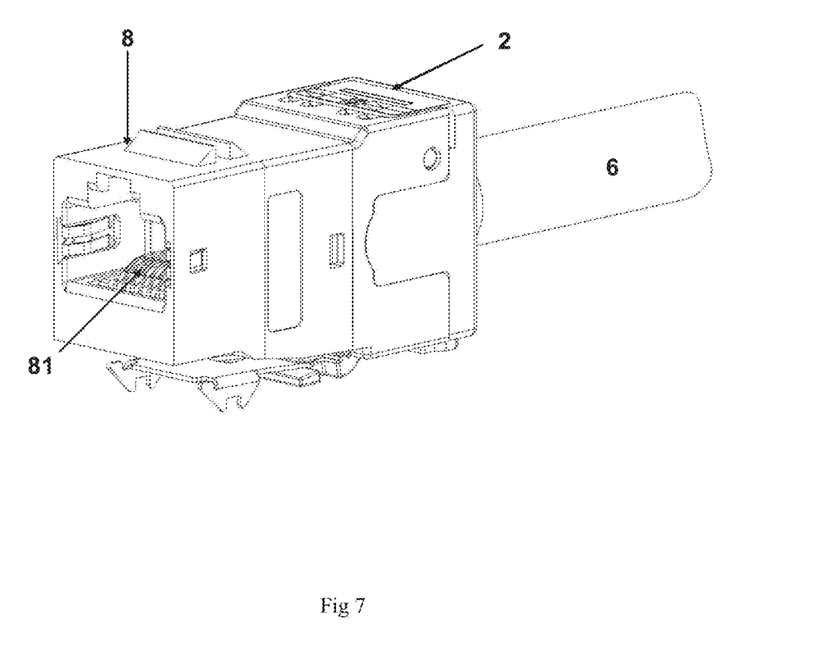
FIG. 7 shows a perspective view of a termination connector.

Therefore, the connector pusher 135 may be moved within the tool 110 from a position of non-checking corresponding to the open working position of the handle 140 to a position of electrical checking of the terminated connector, by means of handle squeezing 140 against the body 111, as shown in FIG. 6.

This permits the checking module 160 to perform tests for detecting the absence or existence of short circuits, discontinuities between the wire and the respective connector terminal, and/or false contacts within the terminated connector.

While the handle 140 is in closing or final position, the connector pusher 135 is inserted in the terminated connector 8 and an electrical circuit of the checking module 160 configured to make the aforementioned electrical checks carries out regular checks within a reduced period of time, in order to determine whether the connector has been correctly terminated.

The checking module 160 comprises at least one visual indicator, for example, LED in order to indicate on the basis of a code of different colours whether the terminated connector has an electrical defect and/or lacks any electrical defect.

Therefore, the operator carrying out the assembly and electrical check on a terminated connector should maintain the handle 140 for a period of time in closing or final position in order to ensure that the checking module 160 shows the existence or absence of an electrical defect in the terminated connector.

The invention claimed is:

1. A termination and checking hand tool for terminating an electrical cable having a plurality of wires with connector terminals of a connector and checking the electrical connections made within the connector, the tool comprising:
   a body which defines a receiving slot configured to receive the connector;
   a handle that is movable from an open to a closed working position in which a connector pusher is displaced to make electrical contact with the connector as the wires of the electrical cable are inserted into the connector terminals; and
   an electrical checking module configured to electrically check electrical connections inside the connector.

2. Tool according to claim 1, wherein the electrical checking module is configured to electrically check each termination of each wire with its corresponding connector terminal.

3. Tool according to claim 1, wherein the tool has a movement from open to close position and vice versa, with a finger pull, an actuation member and the connector pusher making a straight movement.

4. Tool according to claim 1, wherein the checking module comprises an electrical circuit configured to make regular electrical checks, while the connector pusher remains in close or final position, permitting indication of the presence and/or absence of electrical defects of the short circuit type.

5. Tool according to claim 1, wherein the checking module comprises an electrical circuit configured to make regular electrical checks, while the connector pusher remains in close or final position, permitting indication of the presence and/or absence of electrical continuity between each wire with its corresponding connector terminal.

6. Tool according to claim 4, wherein the checking module comprises at least one indicator configured to indicate the presence and/or absence of electrical defects.

7. Tool according to claim 4, wherein the checking module comprises at least one indicator configured to indicate the presence and/or absence of electrical defects.

8. Tool according to claim 6, wherein the indicator comprises at least one LED which, based on a different coloured code determines whether the terminated connector has an electrical defect and/or is free from electrical defects.

9. Tool according to claim 6, wherein the indicator comprises at least one acoustic sound which, based on an acoustic tone code determines whether the terminated connector has an electrical defect and/or is free from electrical defects.

10. An electrical checking module connectable to a termination and checking hand tool for terminating an electrical cable having a plurality of wires with connector terminals of a connector and checking the electrical connections made within the connector; wherein the tool comprises:
 a body which defines a receiving slot configured to receive the connector;
 a handle that is movable from an open to a closed working position in which a connector pusher is displaced to make electrical contact with the connector as the wires of the electrical cable are inserted into the connector terminals; and
 an electrical checking module configured to electrically check electrical connections inside the connector.

11. Electrical checking module according to claim 10, wherein the electrical checking module is configured to electrically check each termination of each wire with its corresponding connector terminal.

12. Electrical checking module according to claim 10, wherein the checking module comprises an electrical circuit configured to make regular electrical checks, while the connector pusher remains in close or final position, permitting indication of the presence and/or absence of electrical defects of the short circuit type.

13. Electrical checking module according to claim 10, wherein the checking module comprises an electrical circuit configured to make regular electrical checks, while the connector pusher remains in close or final position, permitting indication of the presence and/or absence of electrical continuity between each wire with its corresponding connector terminal.

14. Electrical checking module according to claim 12, wherein the checking module comprises at least one indicator configured to indicate the presence and/or absence of electrical defects.

15. Electrical checking module according to claim 12, wherein the checking module comprises at least one indicator configured to indicate the presence and/or absence of electrical defects.

16. Electrical checking module according to claim 14, wherein the indicator comprises at least one LED which, based on a different coloured code determines whether the terminated connector has an electrical defect and/or is free from electrical defects.

17. Electrical checking module according to claim 14, wherein the indicator comprises at least one acoustic sound which, based on an acoustic tone code determines whether the terminated connector has an electrical defect and/or is free from electrical defects.

\* \* \* \* \*